United States Patent [19]

DeKarske

[11] 4,168,541

[45] Sep. 18, 1979

[54] PAIRED LEAST RECENTLY USED BLOCK REPLACEMENT SYSTEM

[75] Inventor: Clarence W. DeKarske, St. Paul Park, Minn.

[73] Assignee: Sperry Rand Corporation, New York, N.Y.

[21] Appl. No.: 945,662

[22] Filed: Sep. 25, 1978

[51] Int. Cl.$^2$ ............................ G11C 8/00; G11C 9/06
[52] U.S. Cl. .................................. 365/230; 364/200; 365/200; 365/49
[58] Field of Search .................... 365/200, 230, 49

[56] References Cited

U.S. PATENT DOCUMENTS

| | | | |
|---|---|---|---|
| 3,967,247 | 6/1976 | Andersen et al. | 340/172.5 |
| 4,045,779 | 8/1977 | Markle | 365/200 |

OTHER PUBLICATIONS

Mitchell, Buffer Page Replacement, IBM Tech. Disc. Bul. vol. 16, No. 5, 10/73, pp. 1377-1378.

Primary Examiner—Stuart N. Hecker
Attorney, Agent, or Firm—Griffin, Branigan & Butler

[57] ABSTRACT

A set associative cache buffer organized with $2^n$ blocks per set requires only $2n-1$ age bits for determining the replacement block within a set. When the cache buffer is addressed and the data sought is not found therein, the age bits determine which block of data in the set should be replaced with new data from the main memory. The block replaced may be either the least recently used block or one of the two least recently used blocks. The replacement logic is such that the buffer may be expanded from two to four blocks per set with minimal impact on the replacement logic. In addition, provision is made for disabling faulty blocks thus allowing the cache buffer and main memory behind it to be utilized in a degraded mode.

10 Claims, 8 Drawing Figures

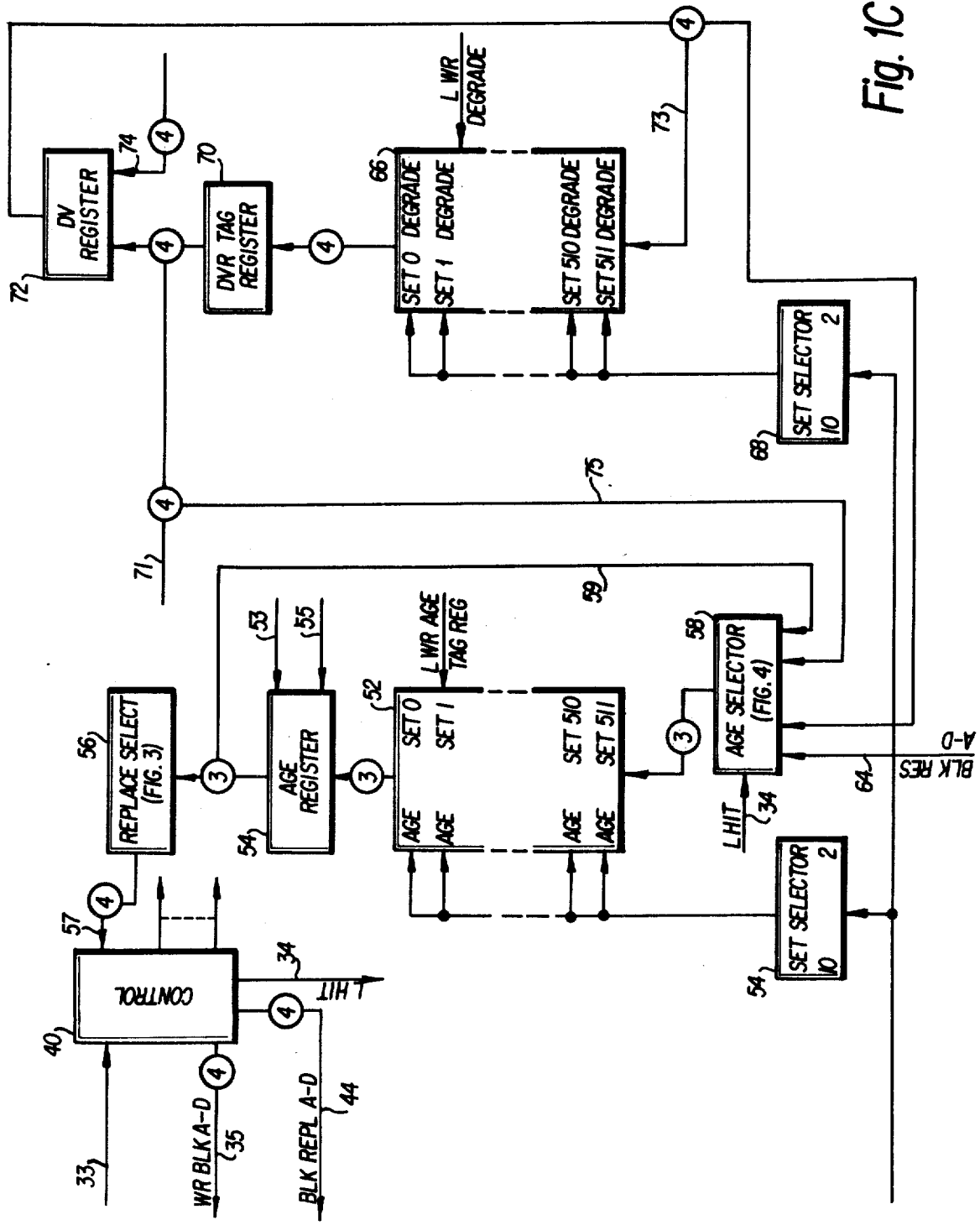

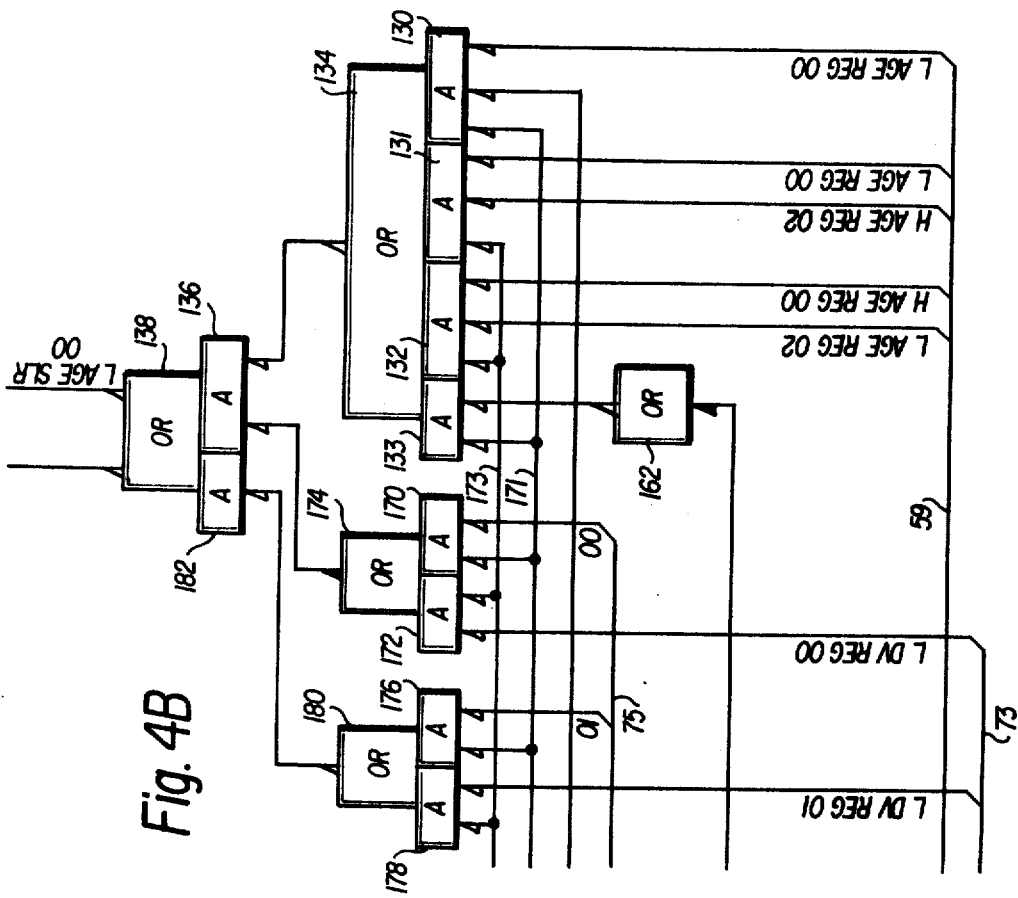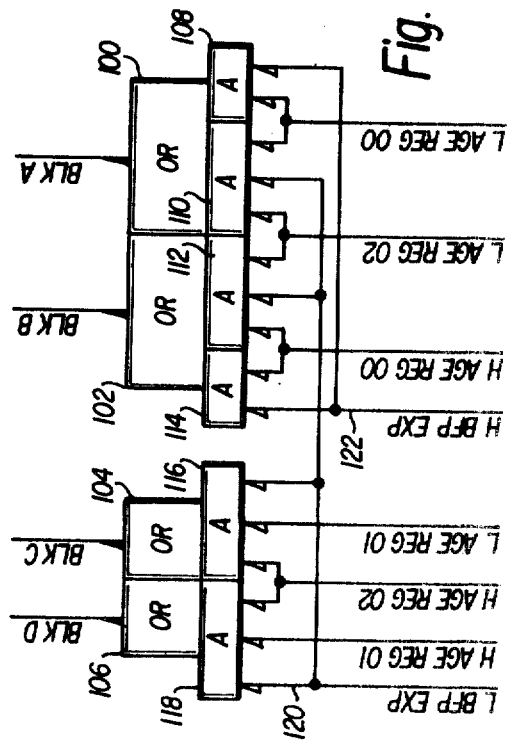

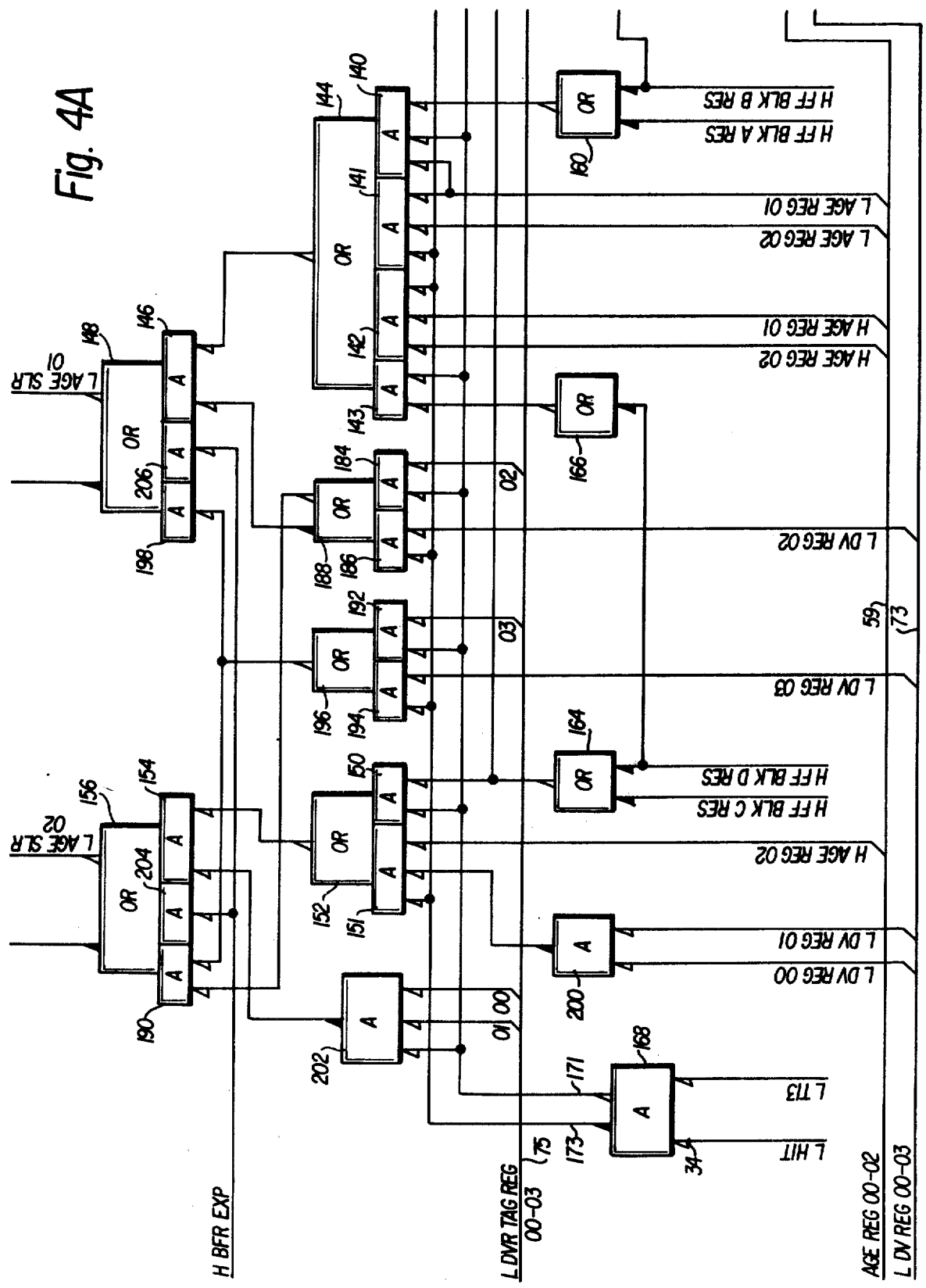

PAIRED LEAST RECENTLY USED BLOCK REPLACEMENT SYSTEM

BACKGROUND OF THE INVENTION

U.S. Pat. No. 3,967,247 to Andersen et al discloses a cache memory or storage interface unit adapted to serve as a high speed buffer between plural requestor units and a relatively low speed main memory in a data processing system. The cache memory provides temporary storage for a limited number of blocks of data stored in the main memory. When a particular address is requested by a requestor unit, a check is made to determine if that address is resident in the high speed buffer and, if so, it is available to the requestor unit for reading or writing. If the desired address is not resident in the cache memory, a block of data in the buffer is selected for replacement. A least recently used (LRU) algorithm is utilized to determine block replacement. This algorithm assumes that the block of a set which has been resident in the high speed buffer for the longest period of time without being used is the least likely block of the set to be used next. Thus, two "age" bits are provided for each block of data contained in the high speed buffer and these age bits are updated each time a block is referenced.

As disclosed in the aforementioned patent, the high speed buffer is capable of storing 128 sets of data with four data blocks per set. Thus, $128 \times 4 \times 2 = 1024$ bits of storage are required merely to store the age bits. In accordance with the principles of the present invention, only three age bits are required for the four blocks within a set hence only 384 bits of storage are required to store the age bits. This represents a considerable saving of storage. Because only three age bits are used, there is a slight increase (0.014%) in the miss rate since replacement may be made of the least recently used block or one of the two least recently used blocks.

In the prior art various methods have been utilized to overcome the problems raised by faulty blocks of the buffer memory. Most of these methods require either considerable programming or additional hardware. The present invention provides a simple method of disabling faulty blocks of the buffer memory by forcing the age bits related to the faulty block or blocks to indicate a "most recently used" status. This assures that the faulty block of the buffer or data memory will never be used.

SUMMARY OF THE INVENTION

An object of the present invention is to provide a set associative memory system for storing sets of blocks of data words and including means for storing a set of age bits for each set of blocks of data words, there being $2n-1$ bits in each set of age bits where $2^n$ is the number of blocks in each set of blocks of data words.

An object of the present invention is to provide an improved replacement means for use with a set associative memory system having a main memory, a buffer memory, a means for applying a main memory address to the buffer memory, the buffer memory having means for storing blocks of data words associatively arranged in sets, means for storing tags representing portions of the main memory addresses for words currently stored in the buffer memory, and means for determining if a word specified by a main memory address applied to the buffer memory is resident therein, the replacement means comprising age buffer means for storing sets of age bits, there being one set of age bits corresponding to each set of blocks of data words in the buffer memory, and $2n-1$ bits in each set of age bits where $2^n$ is the number of blocks in each set of blocks of data words, means for addressing the age buffer means each time the buffer memory is addressed to read from the age buffer means the set of age bits corresponding to the set addressed in the buffer memory, and means responsive to the age buffer means for modifying a set of age bits read therefrom and returning the modified set of age bits to the age buffer means, the modified set of age bits designating the two least recently used blocks in the set corresponding to the set of modified age bits.

A further object of the invention is to provide an improved replacement means as described above for use in a set associative memory system wherein each set comprises four blocks of data words and wherein each set of age bits comprises three bits, a first of said age bits indicating which of two blocks of a pair of said blocks is the least recently used, a second of said age bits indicating which block of a second pair of said blocks is the least recently used of the pair, and a third of said age bits indicating which of said pairs of blocks is the least recently used.

Another object of the present invention is to provide an improved replacement means as described above wherein the logic is such that the system may be easily expanded from two to four blocks per set with minimal impact on the replacement logic.

Still another object of the invention is to provide means for storing degrade bits, one for each block in the cache memory, and means for modifying the age bits for a set in accordance with the values of said degrade bits whereby a defective block may be disabled by forcing the age bits of a set to indicate that the defective block is the most recently used.

Other objects of the invention will become apparent upon consideration of the accompanying drawings and the following description of a specific preferred embodiment.

BRIEF DESCRIPTION OF THE DRAWINGS

FIGS. 1A and 1B when arranged as shown in FIG. 1C comprise a block diagram of a set associative memory system in combination with the degrade controls and least recently used replacement means of the present invention;

FIG. 2 is a chart illustrating the updating of age bits and block replacement for various match/no match conditions;

FIG. 3 is a logic diagram of the circuit for selecting which block is to be replaced when a miss occurs.

FIGS. 4A and 4B, when arranged as shown in FIG. 3C, comprise a logic block diagram of the age selector.

DETAILED DESCRIPTION OF THE INVENTION

Figure 1A:
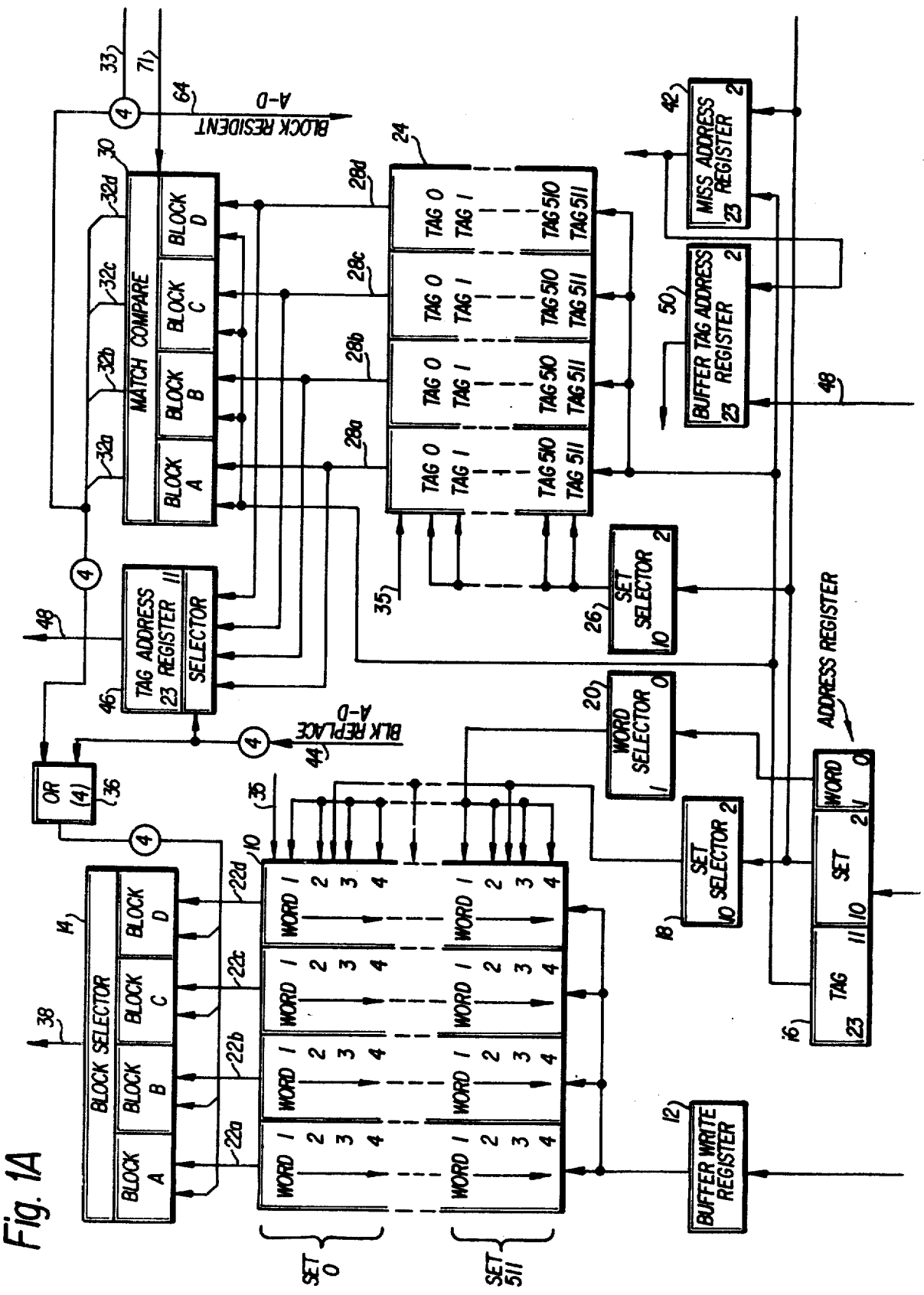

FIG. 1A illustrates in block form a typical high speed buffer or cache memory system essentially as taught in Andersen et al U.S. Pat. No. 3,967,247. However, the sizes of the main memory and cache memory are illustrated as being larger. Reference may be made to the patent of Andersen et al for a complete description of the system, the following summary being for the purpose of setting the background of the present invention. The system includes a Cache Memory 10 for storing 512 sets of blocks, there being four blocks per set and four words per block. Data words from a processor or a main memory (not shown) may be entered into a Buffer Write Register 12 for writing them into the cache memory. Words may be read out of Cache Memory 10 to the processor or main memory through a Block Selector 14.

For a read access, the central processor applies a 24 bit word to an Address Register 16 for the purpose of addressing the Cache Memory 10. Bits 2-10 of the address define the set being accessed. These bits are applied to a Set Selector 18 which decodes the set bits and selects one of the 512 sets in the Cache Memory 10. Bits 1 and 0 define which word of a set is to be accessed. These bits are applied to a Word Selector 20 which decodes the bits to access one of the four words of the selected set. Thus, each time an address is placed in Address Register 16 four data words are read out of the Cache Memory 10 to the Block Selector 14, one word over each of the buses 22a-22d.

A Tag Buffer 24 is provided for storing tags representing the main memory address bits 23-11 of the words currently in the Cache Memory 10. The Tag Buffer 24 has 512 addresses, there being one address corresponding to each of the sets in Cache Memory 10. Each address in the tag buffer stores four tags, there being one tag for each block of words in a set. A Set Selector 26 is connected to the Address Register 16 for the purpose of receiving bits 10-2 therefrom. Set Selector 26 decodes these bits and selects one of the 512 addresses so that four tags are concurrently read out over buses 28a-28d to a Match Compare circuit 30.

The Match Compare circuit 30 includes four comparison circuits (Block A-Block D) each of which receives a tag when the Tag Buffer 24 is read out. Bit positions 23-11 of Address Register 16 are connected to the second set of inputs of each of the block comparison circuits.

If an address is entered into Address Register 16 for the purpose of reading a word from Cache Memory 10, and the word is present in the cache memory, it is read out as follows. The set and word portions of the address act through selectors 18 and 20 to select four words from four blocks (Blocks A-D) in a single set. The word from block A is read out over bus 22a to the block A selector 14 while the words from blocks B, C and D are read out over the buses 22b, 22c and 22d to the block B, block C, and block D selectors, respectively. The set portion of the address also acts through Set Selector 26 to read out the four tags for a selected set, each of these tags being the tag for a particular block within the selected set. These tags are read out over the buses 28a, 28b, 28c and 28d to the block A, block B, block C and block D comparison circuits 30. The tag portion of the address from Address Register 16 is applied to all of the block comparison circuits and, since it is assumed that the addressed word is present in the memory there will be at least one equality upon comparison. Depending upon whether the comparison is made on the block A, block B, block C or block D tag, one of four flip-flops in the Match Compare circuit 30 will be set and a signal will appear on one of the leads 32a-32d. In addition, the signals on leads 32a-32d are applied over bus 33 to the control circuit 40. The control circuit produces the signal L Hit on lead 34 to indicate that the word being sought is present in the cache memory. The match signals on leads 32a-32d are applied through four ORs 36 to the Block A-Block D selectors 14 to select the block to be read out through the block selectors. For example, if the block A tag read out of the tag buffer 24 over the bus 28a compares with the tag portion of the address, then a signal on lead 32a passes through one of the ORs 36 to enable the block A selector 14 and thus gate the Block A word read from Cache Memory 10, over the bus 22a through the Block Selector 14, and over a bus 38 to a buffer read register (not shown). If the access of the cache memory for the purpose of reading a word from the memory, then the word on bus 38 is entered into the buffer read register.

On the other hand, if the access was for the purpose of writing a word into the Cache Memory 10 then the word, present in Buffer Write Register 12, is written into the cache memory at the address specified by the set and word portions of the address in Address Register 16. In this case, the outputs of the match compare circuits causes the control circuit 40 to produce one of the signals Write Block A-D on bus 35, these signals being applied to Cache Memory 10 to determine which block of the selected set is written into.

If a word being accessed is not present in the Cache Memory 10, then it is necessary to replace one block of four words in the cache memory with a new block of four words from the main memory. The operation of the device is as described above up until the point where the tags are applied to the block A-block B Match Compare circuits 30. If the desired word is not resident in the cache memory none of the compare circuits will produce a signal on one of the leads 32a-32d. Control circuit 40 senses this condition and carries out a block replacement routine. In addition, the signal L Hit on lead 34 is driven to the high level to indicate a miss.

The address in Address Register 16 must be saved so on the first step of the replacement routine it is copied into Miss Address Register 42. Next, the block replace select circuit 56 generates one of four signals (Block A-Block D) on one of four leads in a bus 57. The generated signal represents the block in Cache Memory 10 which should be replaced with a new block of data from main memory, the new block containing the word which was addressed and found not present in the cache memory. In U.S. Pat. No. 3,967,247 the generated signal is determined by age bits read from the Tag Buffer 24, there being 2 age bits stored in the buffer for each block of four words in the cache memory. As subsequently described in detail, the select circuit 56 of the present invention produces an output signal on bus 57 in response to three age bits obtained from an Age Buffer 52 through an Age Register 54. The control circuit 40 senses the absence of a compare signal on any of the leads in bus 33 (thus indicating a miss) and gates the signal on bus 57 out to a lead in a bus 44 as one of the signals Block A Replace-Block D Replace. These signals indicate which of the blocks in Cache Memory 10 is to be replaced. The Block Replace signals on bus 44 are applied to a selector on the input of a Tag Address Register 46 (FIG. 1A). The Tag Address Register selector is also connected to receive the Block A-Block D tag addresses from the Tag Buffer 24. The control circuit 40 causes the set portion of the address in Address Register 16 to act through set selector 26 to read from the Tag Buffer 24 the tags for the set containing the block being replaced. Depending upon which of the signals Block Replace A-Block Replace D is present on bus 44, either the block A, block B, block C or block D tag is gated from Tag Buffer 24 into the Tag Address Register 46. From Tag Address Register 46 the selected tag is transferred over bus 48 to a Buffer Tag Address Register 50.

Following this operation the control circuit 40 sends a read request to the main memory to initiate the readout of the four-word block designated by the address contained in the Miss Address Register 42. The main memory begins reading out the four words of the address block specified by the address in the Miss Address Register 42, these four words being loaded into a temporary holding register in the main memory. While this operation is taking place the block of words in Cache Memory 10 that are to be replaced may be read from the memory to a temporary holding register. The control circuit 40 issues a read request to the Cache Memory 10 and on four successive cycles the four words of the block to be replaced are read out through Block Selector 14 to a further temporary holding register. During this interval, one of the Block Replace signals on bus 44 is applied through one of ORs 36 to enable one of the block selectors 14 thus permitting the four words of the selected block to pass through one of the selectors. Control 40 may then issue a main memory write request to cause the memory to enter the four words of the block being replaced into the main memory as described in the aforementioned patent.

Next, the four words read from the memory and present in the temporary holding register are read into the Cache Memory 10 on four successive cycles. The tag and set portions of the address in the Miss Address Register 42 are transferred through the Buffer Tag Address Register 50 to the Address Register 16 so that the set portion of the address may select the proper set. A Write Block signal on the bus 35 selects the block to be written while the word selector 20 is incremented on each of four cycles in order to write the four words into the selected block of the selected set.

As the first replacement word is written into Cache Memory 10, the tag portion of the address is stored in Tag Buffer 24. The set portion of the address from Address Register 16 operates through set selector 26 to select one set of tags for replacement. A Write Block signal on the bus 35 selects which of the four tags of the selected set is to be replaced. The new tag is applied directly from the Address Register 16 to the data inputs of the Tag Buffer 24 and stored at the selected position.

In the system described above, and in accordance with the teachings of the aforementioned patent, two age bits are provided for each block. Since there are 512 sets each containing four blocks, over 4,000 bits of storage are required for storing the age bits. These age bits are stored in the buffer memory 24 and are read out to a replacement control means which operates on a miss to determine which block should be replaced. In accordance with the present invention only three age bits are required for each set of four blocks rather than eight as in the aforementioned patent. The age bits are stored in an Age Buffer 52. The buffer 52 is capable of storing 512 words of four bits each. The fourth bit is utilized for parity checking the age bits and will not be discussed further herein. Each time the Cache Memory 10 is addressed, the set portion of the address is applied to a set selector 54 which selects a corresponding address in the Age Buffer 52. The three age bits at the selected address are read out to an Age Register 54. The Age Register 54 is enabled to receive the output of the Age Buffer 52 by a signal on either of two leads 53 and 55. The signal on lead 53 occurs during each cycle that the central processor loads the Address Register 16 and makes a request. The signal on lead 55 is generated by control circuit 40 on the first of the four cycles during which a replacement block is being transferred from main memory to Cache Memory 10. The output of the Age Register is applied to the select circuit 56 and an Age Selector 58, both of which are hereinafter described in detail.

As in the prior art system described above, the outputs from select circuit 56 indicate which block should be replaced if the word being accessed is not present in the Cache Memory 10. In this event, control circuit 40 receives the signals Block Resident A-D from the Match Compare circuit 30 and since all of these signals are false the select signal from select circuit 56 is gated through control circuit 40 to become one of the signals Block Replace A-D. Also, in the case of a miss the hit signal on lead 34 is false and it enables gating means in an Age Selector 58 so that updated age bits are determined only from the prior values of the age bits received from the Age Register 54, the updated age bits then being entered into the Age Buffer 52.

On the other hand, if the word being accessed is resident in the Cache Memory 10 the Match Compare circuit 30 generates one of the signals Block Resident A-Block Resident D, and when applied to the control circuit 40 this signal inhibits the output of a block replace signal on bus 44 and causes generation of the signal L Hit on lead 34. The hit signal is applied as an enabling signal to the Age Selector 58. The Age Selector 58 further receives the signals Block Resident A-D on bus 64 and, in a manner subsequently described, updates the age bits from the Age Register 54 in accordance with the block resident signals. The updated age bits are then applied to the age buffer 52 and written therein when the signal L Write Age Tag Register is generated by the control circuit 40.

One advantage of the present invention is that the memory may be operated in a degraded mode if a block of cache memory or main memory is defective. This is accomplished by forcing certain of the age bits for the selected set to particular values which indicate that the particular block was the most recently used.

Degrade bits representing defective blocks are stored in a Degrade Buffer 66 having 512 addresses each capable of storing four degrade bits. The buffer 66 also stores additional bits for purposes not relevant to the present explanation. The four degrade bits for a particular set are addressed simultaneously and at the same time as the Cache Memory 10. The set portion of the address is applied from Address Register 16 to a set selector 68 which decodes the address and selects one of the addresses in the Degrade Buffer 66. The four degrade bits for the addressed set are read out simultaneously to a Degrade Valid Request (DVR) Tag Register 70. From DVR Tag Register 70, the degrade bits are applied over a bus 71 to the Match Compare circuits 30 to disable the comparison circuit for a particular block or blocks if their associated degrade bits are set.

There is one degrade bit associated with each block of a set. Degrade bit 00 is associated with Block A while degrade bits 01, 02, and 03 are associated with Blocks B, C, and D, respectively. In order to disable a block its associated degrade bit is set to one. If more than one block of a set is defective, then more than one degrade bit may be set.

The setting of the degrade bits is accomplished as follows. The outputs from the DVR Tag Register 70 are applied to a DV Register 72 and the output of the DV Register is connected back to the data input of the Degrade Buffer 66. When a block replacement routine takes place and the error checking circuits detect that there is a defect in the information read from the main memory, a signal is applied to one of four leads in a bus 74 depending upon which of the four Blocks A, B, C or D is being replaced. The degrade bits from bus 74 are logically combined with the degrade bits entered into the DV Register 72 from the DVR Tag Register 70. For example, assume that degrade bit 00 for set 0 is true and a Block D replacement takes place. The degrade bits having the value 0001 are read out of the degrade buffer 66 and through the DVR Tag Register 70 to the DV Register 72. If the error detection circuit determines that the replacement block D is defective, it generates a signal on a lead in bus 74 that sets the fourth bit position in the DV Register so that the register contains the value 1001. This indicates that both blocks A and D are defective. The degrade bits then applied to the data input of the Degrade Buffer 66 so as to be written into the Degrade Buffer at the same time the age bits are written into the Age Buffer 52. On a subsequent read-out of the same set, blocks A and D of the Block Comparison circuit 30 will be disabled.

The outputs from the DVR Tag Register 70 and the DV Register 72 are applied as inputs to the Age Selector 58. If an access of the Cache Memory 10 results in a hit then the contents of the DVR Tag Register 70 are utilized in determining the value of the updated age bits. On the other hand, if a miss occurs then the degrade bits from the DV Register 72 (after modification by any signals on bus 74) are utilized in the Age Selector 58 for the purpose of determining the value of the upgraded age bits. The exact manner in which this is accomplished will become evident from the subsequent description of FIGS. 4A and 4B.

FIG. 2 illustrates in chart form which block of a set is replaced and how the age bits are updated for each match (hit or no-match (miss) condition. Column 1 shows the match/no-match condition, column 2 shows the values of the age bits before updating to account for the match condition occuring in column 1, column 3 shows the values of the age bits after updating to account for the match condition of column 1, and column 4 indicates the block which is replaced. Blocks A and B comprise a first pair of blocks (AB pair) and blocks C and D comprise a second pair of blocks (CD pair). Age bit 2 designates which pair of blocks contains the block that was least recently used. If block A or block B is used then age bit 2 is set to zero to indicate that the AB pair contains the most recently used block. Stated differently, age bit 2 is set to zero to indicate that the CD pair contains one of the least recently used blocks. On the other hand, if block C or block D is used then age bit 2 is set to 1 to indicate that the AB pair contains one of the least recently used blocks.

Age bit 1 indicates which block of the CD pair is the least recently used block of that pair. If block C is used age bit 1 is set to zero to indicate that block C is the most recently used and block D is the least recently used block of the pair. On the other hand, if block D is used age bit 1 is set to 1. Age bit 0 provides an indication of which block of the AB pair is the least recently used block of the pair. If block A is used age bit 0 is set to zero to indicate that block A is the most recently used block of the pair and block B is the least recently used. On the other hand, if block B is used age bit 0 is set to 1 to indicate that block A is the least recently used block of the pair.

The three age bits can assure that the two most recently used blocks are not replaced when a replacement is required, and only the two least recently used blocks are the candidates for replacement. If the two least recently used blocks are in the same pair, the least recently used block is replaced. However, if the two least recently used blocks are in different pairs then the least recently used block is replaced if it is not in the pair with the most recently used block. If the least recently used block is in the pair with the most recently used block then the second least recently used block is replaced.

FIG. 3 shows the details of the select circuit 56 which determines from the age bits which block should be replaced when a miss occurs. The select circuit includes ORs 100, 102, 104 and 106 and a plurality of ANDs 108, 110, 112, 114, 116 and 118. ANDs 108 and 110 drive OR 100 to produce the signal Block A. ANDs 112 and 114 drive the OR 102 to produce the signal Block B. AND 116 drives OR 104 to produce the signal Block C while AND 118 drives OR 106 to produce the signal Block D. The Block A-Block D signals are applied over the bus 57 (FIG. 1B) to the control circuit 40.

For the present it may be assumed that the leads 120 and 122 are permanently connected to low and high sources of voltage, respectively. Thus, the signal L Buffer Expansion permanently enables one input of each of ANDs 110, 112, 116, and 118 while the signal H Buffer Expansion permanently disables ANDs 108 and 114. The signal L Age Register 00 is derived from the low order stage of Age Register 54 and is connected to one input of each of ANDs 108 and 110 while the signal H Age Register 00 is connected to one input of each of ANDs 112 and 114. The signal L Age Register 01 is applied to one input of AND 116 while the signal H Age Register 01 is applied to one input of AND 118. The signal L Age Register 02 is applied to one input of each of the ANDS 110 and 112 while the signal H Age Register 02 is applied to one input of each of ANDs 116 and 118.

The circuit of FIG. 3 responds to the values of the age bits in the Age Register 54 to produce a signal which controls replacement of one of the blocks A, B, C or D upon occurrence of a miss. At the same time a set address is applied to the Cache Memory 10 and the Tag Buffer 24, the address is also applied through selector 54 to the Age Buffer 52. The 3-bit LR code age value is read from the Age Buffer 52 into the Age Register 54 and applied to the select circuit of FIG. 3.

Assume first that the age bits (LR code age value) entered into the Age Register 54 and applied to the select circuit of FIG. 3, have a value 00X. From FIG. 2, it is seen that under these conditions block D should be replaced. The signals H Age Register 01 and H Age Register 02 enable AND 118 which produces an output signal that passes through OR 106 to become the signal Block D on bus 57. When applied to the control circuit 40, the Block D signal causes the generation of the signal Block Replace D on bus 44 if a miss condition exists.

From FIG. 2 it is seen that block C should be replaced if the age bits 2-0 have the value 01X and no match is detected. In this case the signals H Age Register 02 and L Age Register 01 are both at the low level and enable AND 116. The output from AND 116 passes through OR 104 to become the signal Block C which is applied to control curcuit 40 over bus 57.

FIG. 2 shows that if the age bits 2-0 have the value 1X0 then block B should be replaced. The signals H Age Register 00 and L Age Register 02 are both at the low level and enable AND 112. The output of AND 112 passes through OR 102 to become the signal Block B.

Block A should be replaced on a no match condition if the age bits 2-0 have the value 1X1. The signals L Age Register 02 and L Age Register 00 enable AND 110. AND 110 produces an output signal that passes through OR 100 to become the signal Block A.

The Age Selector 58 is shown in FIGS. 4A and 4B. The Age Selector receives LR code age values from the Age Register and match condition signals from the Match Compare circuit 30 and operates upon these signals to produce updated LR codes in accordance with the chart of FIG. 2.

The age selector comprises three stages, one for each age bit. Stage 1 includes four ANDs 130-133 for driving an OR 134. The output of OR 134 is connected to an AND 136 which drives an OR 138 to produce the signal L Age Selector 00. In like manner, stage 2 of the selector includes four ANDs 140-143 for driving an OR 144 with the output of OR 144 being connected to one input of an AND 146. AND 146 drives an OR 148 to produce the signal L Age Selector 01. Stage 3 of the selector includes an AND 150 and 151 having outputs connected through an OR 152 to one input of an AND 154. The output of AND 154 passes through an OR 156 to become the signal L Age Selector 02.

The output signals from the Age Register 54 are applied to the Age Selector as follows. The signal L Age Register 00 is applied to ANDs 130 and 131. The signal H Age Register 00 is applied to AND 132. The signal L Age Register 01 is applied to ANDs 140 and 141 while the signal H Age Register 01 is applied to AND 142. The signal L Age Register 02 is applied to ANDs 132 and 141 while the signal H Age Register 02 is applied to ANDs 131, 142 and 151.

The block resident signals generated by the Match Compare circuit 30 are also applied to the Age Selector. The signal H FF Block A Resident is applied through an OR 160 to AND 140. The signal H FF Block B Resident is applied through OR 160 to AND 140 and through an OR 162 to AND 133. The signal H FF Block C Resident is applied through an OR 164 to AND 150. The signal H FF Block D Resident is applied through OR 164 to AND 150 and through an OR 166 to AND 143.

The hit signal generated by the control circuit 40 on lead 34 is applied to an AND 168 where it is conditioned by a signal LT13. This signal is produced for one clock cycle following a processor request for access to Cache Memory 10. If a hit occurs then for the duration of LT13 AND 168 produces a low level output signal on lead 171 which enables one input of ANDs 150, 143, 140, 133 and 130. On the other hand, if a miss occurs then the output lead 173 from AND 168 is at the low level thereby enabling one input of ANDs 151, 142, 141, 132 and 131.

When the memory is operating in a normal or non-degraded mode, the Age Selector circuits just described function to receive the LR code age value from the Age Register 54 to generate an updated LR code which is entered into the Age Buffer 52. The updating is accomplished in accordance with the chart shown in FIG. 2.

The Age Selector also includes gating means responsive to a degrade code obtained from the DVR Tag Register 70 or the DV Register 72 for forcing certain of the age bits to particular values during the updating operation. For stage 00 of the Age Selector, the degrade gating means comprises two ANDs 170 and 172 having outputs connected through an OR 174 to AND 136, and two ANDs 176 and 178 having their outputs connected through an OR 180 to an AND 182. The output of AND 182 drives OR 138.

For stages 01 and 02 the degrade gating means includes two ANDs 184 and 186 having their outputs connected to an OR 188. OR 188 has a first output connected to AND 146 and a second output connected to an AND 190 which in turn drives OR 156. The degrade gating means also includes ANDs 192 and 194 having their outputs connected through an OR 196 to the AND 190 and to an AND 198 which drives OR 148. The degrade gating means includes a further AND 200 having an output connected to AND 151 and an AND 202 having an output connected to AND 154.

As previously explained, when the memory is operating, or is to operate, in a degraded mode, one or more bits in the DV Register 72 or DVR Tag Register 70 are set. When a particular register stage is set then the signal as applied to FIGS. 4A and 4B is at the low level. If stage 00 of either the DVR Tag Register 72 or the DV Register 70 is set then the memory operates in the degraded mode with Block A disabled. Blocks B, C and/or D are disabled if stages 01, 02 and/or 03 are set.

Stages 00, 01, 02 and 03 of the DV Register 72 are connected as inputs to ANDs 172, 178, 186 and 194, respectively. These ANDs are all connected to the lead 173 hence the contents of the DV Register 72 can effect the age selector circuitry only if a miss occurs. Stages 00 and 01 of the DV Register 72 are applied to AND 200 and if both stages are set AND 200 produces an output signal to disable AND 151. However, if both stages are not set AND 200 enables AND 151 which is further enabled by the signal on lead 173 only if a miss occurs.

The output of the DVR Tag Register 70 can effect the Age Selector output only if a hit occurs. Stages 00, 01, 02 and 03 are connected to ANDs 170, 176, 184 and 192, respectively. These ANDs are further enabled by the signal on lead 171 when a hit occurs. In addition, stages 00 and 01 are connected to AND 202 which is also enabled by the signal on lead 171 when a hit occurs.

As an example of the operation of the Age Selector, assume that the memory is operating in a non-degraded mode and that an address applied to the Cache Memory 10 results in a Block A match. The Match Compare circuit 30 produces the signal H FF Block A Resident on bus 34. This signal is also applied over bus 33 to cause control circuit 40 to issue the signal L Hit. The signal LHit drives the output 171 of AND 168 to the low level and the out lead 173 to the high level. Since it is assumed that the memory is operating in a non-degraded mode all signals from the DV Register 72 and the DVR Tag Register 70 are at the high level on buses 73 and 75. Furthermore, since it is assumed that the access has resulted in a Block A hit the signals FF Block C Resident, FF Block D Resident and FF Block B Resident are all at the low level so that the output of ORs 164, 166 and 162 are all at the high level. Thus, ANDs 130-133, 170, 172, 176, 178, 141-143, 184, 186, 192, 194, 150, 151 and 202 are all blocked. The resulting outputs from ORs 134 and 180 block ANDs 136 and 182 while the outputs from ORs 188 196 and 152 block ANDs 190, 198 and 154. Thus, the signals L Age Selector 00 and L Age Selector 02 derived from the outputs of ORs 138 and 156, respectively, are both false or zero. Note that this corresponds with FIG. 2 where age selector bits 00 and 02 should both be set to zero on a Block A match.

FIG. 2 shows that age bit 01 should not be changed under the assumed conditions. The signal H FF Block A Resident is inverted at OR 160 and enables AND 140. The AND is further enabled by the low level signal on lead 171. If age bit 01 was previously a one then the signal L Age Register 01 passes through AND 140, OR 144, AND 146 (now enabled by the low level output from OR 188) and through OR 148 to produce the signal L Age Selector 01. On the other hand, if age bit 01 was previously a zero then the signal L Age Register 01 is false and blocks AND 140 so that the signal L Age Selector 01 is false. Thus, the output of OR 148 is either a zero or a one depending upon whether the previous value of the age bit was a zero or a one, respectively.

Assume now the same conditions as stated above but with the degrade bit for Block B of the accessed set being set to disable the block. When the Degrade Valid Buffer 66 is read out to the DVR Tag Register 70 the degrade bit for Block B sets stage 01 of the DVR Tag Register so that the signal L DVR Tag Register 01 is at the low level. In FIG. 1A, this signal disables the Block B comparison circuits. In FIG. 4B, the signal is applied to AND 176. The AND is further enabled by the low level signal on lead 171 so that the output of AND 176 passes through OR 180, AND 182 and OR 138 to generate the signal L Age Selector 00. The updated age bits 1 and 2 are generated by the age selector as described above. Thus, instead of the age selector updating the age bits to 0-NC-0 on a Block A match it updates the age bits to 0-NC-1. Thus, the next time it becomes necessary to choose between Block A and Block B for replacement, the circuit will choose Block A for replacement instead of the disabled Block B.

As a further example of the operation of the Age Selector assume that the Cache Memory 10 is operating in the non-degraded mode and an address applied thereto results in a miss. Assume further that the age bits 2-0 have the value 00X. From FIG. 2 it is seen that under these conditions age bits 2 and 1 should be set and there should be no change in age bit 0.

For age bit 0, the low level signal on lead 173 enables AND 131. Since it is assumed that age bit 2 is zero the signal H Age Register 02 is at the low level to further enable AND 131. Depending upon whether age bit 0 is one or zero, the signal L Age Register 00 will be low or high respectively. Assuming it is low, the output of AND 131 passes through OR 134, AND 136, now enabled by the low level output from OR 174, and through OR 138 to generate the signal L Age Selector 00. On the other hand, if age bit 0 is zero then the signal L Age Register 00 blocks AND 131 and the output of OR 138 is at the high level so that the updated age bit 0 is a zero.

From FIG. 2 it is seen that under the assumed conditions the updated age bits 1 and 2 should both be 1. The low level signal on lead 173 enables AND 142. The signals H Age Register 02 and H Age Register 01 further enable AND 142 and it produces an output signal that passes through OR 144 to AND 146. The other input of AND 146 is enabled at this time by a low level output from OR 188 so the output of AND 146 passes through OR 148 to generate the signal L Age Selector 01.

The low level signal on lead 173 enables AND 151. Since a non-degraded mode is assumed, the signals L DV Register 00 and L DV Register 01 are both at the high level and AND 200 produces an output to further enable AND 151. The signal H Age Register 02 is at the low level so it passes through AND 151 and OR 152 to AND 154. AND 202 is blocked so its output enables AND 154. The output of AND 154 passes through OR 156 to become the signal L Age Selector 02.

As a further example of the updating of the age bits by the Age Selector on a Cache Memory access which results in a miss, assume that the Block B degrade bit is already set in Degrade Buffer 66. Assume further that the select circuit 56 determines that Block A is to be replaced. The degrade bits are read out of buffer 66 to the DVR Tag Register 70, but, because of the miss condition the output 171 of AND 168 prevents the contents of the register from affecting the Age Selector. The degrade bits are then transferred to the DV Register 72. When the replacement block is read out of main memory, it is checked for errors. Assuming an error exists, bit 00 of the DV Register is set. Bit 01 is already set since it was assumed that Block B was already disabled. Thus, the value 0011 stands in the DV Register. On the loading of the first word of the replacement block into the Cache Memory 10, this value is loaded in buffer 66. Also, it is applied to the Age Selector 58 to aid in determining the updated age bits which are entered into the Age Buffer 52.

Referring to FIGS. 4A–4B the age bits from the Age Register will have the value XX1, the inputs from the DV Register will be 0011, and the lead 173 will be at the low level because of the miss. Under these conditions the updated age bits, represented by L Age Selector 02-00 will be 0X1 so that the next replacement will be of Block C or Block D.

On alternate replacement routines, alternate Blocks C and D will be replaced because degrade bits 0 and 1 disable Blocks A and B. On a Block C or D hit, the AND 202 is enabled to block AND 154 and thus keep Age Selector bit 00 a zero, thereby indicating (falsely) that the least recently used pair is the CD pair. On a Block C or D miss the output of AND 200 blocks AND 151 to obtain the same result.

It is believed unnecessary to trace each of the circuits for each of the various possible conditions affecting the Age Selector and that the reader can easily analyze the circuits after considering the foregoing examples.

The replacement or aging logic circuits of the present invention are easily modified so as to be usable in a set associative memory system having more or less than four blocks per set. The Age Buffer 52 must be wide enough to store $2n-1$ age bits for each set where $2^n$ is the number of blocks in each set. The particular embodiment described above has $2^2$ blocks per set. To modify it for use in a system having two blocks per set the signal H Buffer Expansion (FIG. 4A) is tied to a low level voltage source thereby enabling ANDs 204 and 206. The outputs of these ANDs drive the outputs of ORs 148 and 156 to the low level thereby continuously producing a false indication that the CD pair is the most recently used pair and the D Block was the most recently used block. Thus, the Age Selector will always indicate that one of the blocks in the AB pair is the next one to be replaced. The Buffer Expansion signal does not affect stage 1 of the Age Selector hence it will operate as described above.

To convert from a 4-block to a 2-block per set system, it is also necessary to reverse the polarities of the Buffer Expansion signals on leads 120 and 122 (FIG. 3). With lead 120 at the high level it blocks AND 110, 112, 116 and 118. With ANDs 116 and 118 blocked, the selector can never produce the Block C or Block D signals to cause the replacement of these (non-existent) blocks.

A low level signal on lead 122 enables AND 114 and 108 which receive the signals H Age Register 00 and L Age Register 00. Assuming no degrading bits are set, these signals will be alternately true on alternate Cache Memory accesses so that the signals Block A and Block B are alternately produced to control block replacement when a miss occurs.

While a specific preferred embodiment of the invention has been described in detail in conjunction with a particular prior art cache memory system, it will be understood that the basic principles of the invention may be utilized with other cache memories. Furthermore, although the invention has been particularly shown and described with reference to preferred embodiments thereof, it will be understood by those skilled in the art that various alterations in form and detail may be made therein without departing from the spirit and scope of the invention. For example, the Tag Buffer 24 may be provided with means for storing a valid data bit with each tag, these valid data bits being compared against a forced bit when the comparison of the Address Register 16 output and the Tag Buffer 24 output takes place. In this case Degrade Buffer 66 may additionally store an invalidate bit for each block and the invalidate bit, when set, may be utilized to negate the valid data bits from Tag Buffer 24 to thereby force a mismatch on a particular block comparison where the block is faulty.

The embodiments of the invention in which an exclusive property or privilege is claimed are defined as follows:

1. In a set associative memory system having a main memory, a buffer memory, and means for applying a main memory address to the buffer memory, said buffer memory having means for storing blocks of data words associatively arranged in sets, and means for storing tags representing portions of the main memory addresses for words currently stored in said buffer memory, means for determining if a word specified by a main memory address applied to said buffer memory is resident therein, and replacement control means for replacing a block of data words in said buffer memory with a block of data words from said main when said determining means determines that a word specified by a main memory address is not resident in said buffer memory, the improvement wherein said replacement means comprises:

age buffer means for storing sets of age bits, there being one set of age bits corresponding to each set of blocks of data words in said buffer memory, and $2n-1$ bits in each set of age bits where $2^n$ is the number of blocks in each set of blocks of data words;

means for addressing said age buffer means each time said buffer memory is addressed to read from said age buffer means the set of age bits corresponding to the set addressed in said buffer memory; and, selector means responsive to said age buffer means for modifying a set of age bits read therefrom and returning said modified set of age bits to said age buffer means, said modified set of age bits designating the least recently used block in the set of blocks corresponding to the set of modified age bits.

2. The improvement as claimed in claim 1 where $n=1$.

3. The improvement as claimed in claim 1 where $n=2$.

4. The improvement as claimed in claim 1 and further comprising means connected to said age buffer means and responsive to age bits read therefrom for applying to said replacement control means a signal indicating which block of a selected set should be replaced when it is determined that a word specified by the main memory address is not resident in buffer memory.

5. The improvement as claimed in claim 1 and further comprising a degrade buffer for storing sets of degrade bits, there being $2^n$ degrade bits in each set thereof; means generating degrade bits identifying blocks of invalid data; means for entering said degrade bits into said degrade buffer; means for addressing a set of said degrade bits in said degrade buffer concurrently with an associated set of said age bits to thereby read said degrade bits out of said degrade buffer; and means for applying said degrade bits read from said degrade buffer to said selector means.

6. In a set associative memory system having a main memory, a buffer memory, and means for applying a main memory address to the buffer memory, said buffer memory having first means for storing blocks of data words associatively arranged in sets and second means for storing tags representing portions of the main memory addresses for words currently stored in said buffer memory, a third means for producing a first signal if a word specified by a main memory address applied to said buffer memory is resident therein and, if so, producing signals indicating in which block it is resident, and replacement control means for replacing a block of data words in said buffer memory with a block of data words from said main when said determining means determines that a word specified by a main memory address is not resident in said buffer memory, the improvement wherein said replacement means comprises:

age buffer means for storing sets of age bits, there being one set of age bits corresponding to each set of blocks of data words in said buffer memory, and $2n-1$ bits in each set of age bits where $2^n$ is the number of blocks in each set of blocks of data words;

means for addressing said age buffer means each time said buffer memory is addressed to read from said age buffer means the set of age bits corresponding to the set addressed in said buffer memory; and, selector means responsive to said age buffer means, said first signal, and said signals indicating in which block the addressed word is resident, for modifying a set of age bits read from said age buffer means and returning said modified set of age bits to said age buffer means, said modified set of age bits designating the least recently used block in the set of blocks corresponding to the set of modified age bits.

7. The improvement as claimed in claim 6 wherein there are first and second pairs of blocks per associative set and three age bits in each set of age bits, one of said age bits indicating the pair of blocks containing the least recently addressed block of the set, a second of said age bits indicating the least recently used block of said second pair and a third of said age bits indicating the least recently used block of said first pair.

8. The improvement as claimed in claim 7 and further comprising a selector responsive to age bits, read from said age buffer means, for issuing a signal indicating that one of the two least recently used blocks is the one to be replaced if an addressed word is not resident in said buffer memory.

9. The improvement as claimed in claim 8 and further comprising: a degrade buffer for storing sets of degrade bits indicating invalid blocks, there being a degrade bit for each block in a set; a first register connected to receive degrade bits from said degrade buffer; a second register connected to the output of said first register and the input of said degrade buffer; and means for applying output signals from said first and second registers to said selector means to modify the operation thereof whereby age bits applied to said age buffer from said selector means always indicate that a block is the most recently used block of its pair if its associated degrade bit is set.

10. The improvement as claimed in claim 9 and including means for modifying a set of degrade bits in said second register; and means for writing said modified set of degrade bits into said degrade buffer.

* * * * *

UNITED STATES PATENT AND TRADEMARK OFFICE
CERTIFICATE OF CORRECTION

PATENT NO. : 4,168,541
DATED : September 18, 1979
INVENTOR(S) : Clarence W. DeKarske It is certified that error appears in the above-identified patent and that said Letters Patent are hereby corrected as shown below:

Column 1, line 33, after "set" insert --,--.
Column 1, line 54, change "2n-1" to --$2^n-1$--.
Column 2, line 2, change "2n-1" to --$2^n-1$--.
Column 2, line 47, change ";" to --.--.
Column 2, line 50, change ";" to --.--.
Column 2, line 54, change "3C" to --4C--.
Column 4, line 6, after "memory" insert --is--.
Column 4, line 15, change "causes" to --cause--.
Column 4, line 24, change "block A-block B" to --Block A-Block D--.
Column 4, line 43, change "2" to --two--.
Column 5, line 28, change "transfered" to --transferred--.
Column 5, line 64, change "and" to --or--.
Column 7, line 9, change "degrade" to --Degrade--.
Column 7, line 10, change "buffer" to --Buffer--.
Column 7, line 16, after "bits" insert --are--.
Column 7, line 36, change "(hit" to --(hit)--.
Column 8, line 65, change "curcuit" to --circuit--.
Column 9, line 4, change "no match" to --no-match--.
Column 10, line 51, change "LHit" to --L Hit--.

UNITED STATES PATENT AND TRADEMARK OFFICE
CERTIFICATE OF CORRECTION

PATENT NO. : 4,168,541
DATED : September 18, 1979
INVENTOR(S) : Clarence W. DeKarske It is certified that error appears in the above-identified patent and that said Letters Patent are hereby corrected as shown below:

Column 10, line 52, change "out" to --output--.
Column 10, line     64, change "188 196" to --188, 196--.
Column 11, line 19, cancel "Valid".
Column 11, line 48, after "high" insert --,--.
Column 12, line 14, after "condition" insert --,--.
Column 12, line 24, change "buffer" to --Degrade Buffer--.
Column 12, line 50, change "2n-1" to --$2^n-1$--.
Column 13, line 46, after "main" insert --memory--.
Column 13, line 54, change "2n-1" to --$2^n-1$--.
Column 14, line 34, after "main" insert --memory--.
Column 14, line 41, change "2n-1" to --$2^n-1$--.
Abstract, line 2, change "2n-1" to --$2^n-1$--.

Signed and Sealed this

Twenty-fourth Day of June 1980

[SEAL]

Attest:

SIDNEY A. DIAMOND

Attesting Officer   Commissioner of Patents and Trademarks